United States Patent

Murakami et al.

[11] Patent Number: 6,121,205
[45] Date of Patent: Sep. 19, 2000

[54] BULK SUPERCONDUCTOR AND PROCESS OF PREPARING SAME

[75] Inventors: Masato Murakami, Kamakura; Kazuhiko Sawada, Amagasaki; Naomichi Sakai, Funabashi; Takamitsu Higuchi, Kunitachi, all of Japan

[73] Assignees: International Superconductivity Technology Center; Railway Technical Research Institute, both of Japan

[21] Appl. No.: 08/855,497

[22] Filed: May 13, 1997

[30] Foreign Application Priority Data

May 14, 1996 [JP] Japan .................................. 8-118974

[51] Int. Cl.⁷ .............................. H01L 39/02; H01L 39/24
[52] U.S. Cl. ..................... 505/234; 505/230; 505/236; 505/238; 505/451; 505/470; 505/491; 505/500; 505/701; 505/925; 505/926; 428/697; 428/700; 428/701; 428/702; 428/930; 156/89.11; 156/89.12
[58] Field of Search ...................... 505/220, 230, 505/234, 236, 238, 239, 450, 451, 470, 490, 491, 500, 701, 925, 926; 428/697, 699, 700, 701, 702, 930; 156/89.11, 89.12

[56] References Cited

U.S. PATENT DOCUMENTS

| | | |
|---|---|---|
| 5,079,226 | 1/1992 | Sakai et al. . |
| 5,081,074 | 1/1992 | Murayama et al. . |
| 5,359,149 | 10/1994 | Seike et al. .............................. 505/213 |
| 5,474,976 | 12/1995 | Kondoh et al. .......................... 505/450 |
| 5,521,150 | 5/1996 | Murakami et al. ....................... 505/450 |
| 5,547,921 | 8/1996 | Tani et al. ................................ 505/124 |
| 5,786,304 | 7/1998 | Kimura et al. ........................... 505/234 |

FOREIGN PATENT DOCUMENTS

WO 93/20025  10/1993  WIPO .

OTHER PUBLICATIONS

K. Salama et al. "Joining of high current bulk Y–Ba–Cu–O superconductors", Appl. Phys. Lett., vol. 60, No. 7, pp. 898–900, Feb. 17, 1992.

*Primary Examiner*—Marie Yamnitzky

[57] ABSTRACT

A bulk superconductor including a plurality of units each composed of a substrate and a superconductive layer of R—Ba—Cu—O, where R is selected from La, Nd, Sm, Eu, Gd, Y, Dy, Ho, Er, Tm, Yb and mixtures thereof, formed on the substrate. The units are arranged in a row or in a matrix such that the superconductive layers of respective units are superconductively joined with each other.

11 Claims, 2 Drawing Sheets

BULK SUPERCONDUCTOR AND PROCESS OF PREPARING SAME

BACKGROUND OF THE INVENTION

This invention relates to a bulk superconductor such as a superconducting wire useful as electric cable and a superconducting plate useful as a magnetic shield plate and to a process of preparing same.

The recent technology of superconductors can now produce superconductors having Tc of 90K or more, such as Y—Ba—Cu—O and Bi—Sr—Ca—Cu—O, and operable using liquid nitrogen. For the practical applications, however, it is necessary that such superconductors be shaped in the form of wires, tapes, plates, etc. Known such bulk superconductors, however, cannot be put into practice because the superconductive critical current is unsatisfactory.

For instance, a Bi—Sr—Ca—Cu—O tape having a length of more than 100 m is known. This tape cannot be used in practice at a liquid nitrogen temperature. Further, Bi—Sr—Ca—Cu—O crystal has a high structural anisotropy, i.e. the critical current is high when a magnetic field is applied in the direction normal to the c-axis but is low in the direction parallel with the c-axis. Also known is a pancake coil of Bi—Sr—Ca—Cu—O capable of generating a magnetic field of more than 1 T at 20K. At a liquid nitrogen temperature, however, the magnetic field is only 0.1 T.

When a Y—Ba—Cu—O having a Tc higher than the liquid nitrogen temperature is used for forming a plate in accordance with the powder-in-tube method suitably employed in Bi—Sr—Ca—Cu—O superconductors, the crystal grain boundaries form weak links so that superconducting critical current is extremely low.

SUMMARY OF THE INVENTION

It is, therefore, an object of the present invention to provide a bulk superconductor having no weak links and a high Superconducting critical current.

Another object of the present invention is to provide an elongated superconductor material useful as a power cable.

It is a further object of the present invention to provide a superconductor plate having a large area useful as an electromagnetic shield material.

In accomplishing the foregoing object, one aspect of the present invention provides a bulk superconductor comprising a plurality of units each including a substrate and a superconductive layer of R—Ba—Cu—O, where R is selected from La, Nd, Sm, Eu, Gd, Y, Dy, Ho, Er, Tm, Yb and mixtures thereof, formed on the substrate, the units being arranged in a row or in a matrix such that the superconductive layers of respective units are superconductively joined with each other.

In another aspect, the present invention provides a bulk superconductor comprising a first array of one or more, m-number of units and a second array of two or more, n-number of units, wherein m=n or m=n−1;

each of the units of the first and second arrays including a substrate and a superconductive layer of R—Ba—Cu—O, where R is selected from La, Nd, Sm, Eu, Gd, Y, Dy, Ho, Er, Tm, Yb and mixtures thereof, formed on the substrate, the first and second arrays being assembled together such that the superconductive layer of each one of the units of the first array, except one of the terminal units when m=n, is in contact with and in superconductor joining with two superconductive layers of adjacent two units of the second array, so that the superconductive layers of the n-number of units of the second array are superconductively connected to each other through the superconductive layers of the m-number of units of the first array.

In a further aspect, the present: invention provides a bulk superconductor comprising a first, m×p matrix of units with m-number of first to m-th columns arranged along the X-axis and p-number of first to p-th rows arranged along the Y-axis, wherein m is one or more and p is one or more, and a second, n×q matrix of units with n-number of first to n-th rows arranged along the X-axis and q-number of first to q-th rows arranged along the Y-axis, wherein m=n or m=n−1 and p=q or p=−1, each of the units of the first and second matrixes including a substrate and a superconductive layer of R—Ba—Cu—O, where R is selected from La, Nd, Sm, Eu, Gd, Y, Dy, Ho, Er, Tm, Yb and mixtures thereof, formed on the substrate, the first and second matrixes being assembled together such that the superconductive layer of each one of the units of the first to n-th columns, except one of the terminal units when m=n, is in contact with and in superconductor joining with two superconductive layers of adjacent two units of the first to m-th columns, respectively, and that the superconductive layer of each one of the units of the first to q-th rows, except one of the terminal units when p=q, is in contact with and in superconductor joining with two superconductive layers of adjacent two units of the first to p-th rows, respectively, so that the superconductive layers of the (n×q)-number of units of the second matrix are superconductively connected to each other through respective superconductive layers of the (m×p)-number of units of the first matrix.

In a further aspect, the present invention provides a method of fabricating a bulk superconductor, comprising the steps of:

providing a first array of one or more, m-number of units and a second array of two or more, n-number of units, wherein m=n or m=n−1, each of the units of the first and second arrays including a substrate and a superconductive layer of R—Ba—Cu—O, where R is selected from La, Nd, Sm, Eu, Gd, Y, Dy, Ho, Er, Tm, Yb and mixtures thereof, formed on the substrate; and assembling the first and second arrays together such that the superconductive layer of each one of the units of the first array, except one of the terminal units when m=n, is in contact with and in superconductor joining with two superconductive layers of adjacent two units of the second array, so that the superconductive layers of the n-number of units of the second array are superconductively connected to each other through the superconductive layers of the m-number of units of the first array.

The present invention further provides a method of fabricating a bulk superconductor, comprising the steps of:

providing a first, m×p matrix of units with m-number of first to m-th columns arranged along the X-axis and p-number of first to p-th rows arranged along the Y-axis, wherein m is one or more and p is one or more, and a second, n×q matrix of units with n-number of first to n-th rows arranged along the X-axis and q-number of first to q-th rows arranged along the Y-axis, wherein in m=n or m=n−1 and p=q or p=q−1, each of the units of the first and second matrixes including a substrate and a superconductive layer of R—Ba—Cu—O, where R is selected from La, Nd, Sm, Eu, Gd, Y, Dy, Ho, Er, Tm, Yb and mixtures thereof, formed on the substrate; and assembling the first and second matrixes together such that the superconductive layer of each one of the units of the first to n-th columns, except one of the terminal units when m=n, is in contact with and in superconductor joining with two superconductive layers of adjacent two units of the first to math columns, respectively, and that the superconductive layer of each one of the units of the first to q-th rows, except one of the terminal units when p=q, is in contact with and in superconductor joining with two superconductive layers of adjacent two units of the first to p-th rows, respectively, so that the superconductive layers of the (n×q)-number of units of the second matrix are superconductively connected to each other through respective superconductive layers of the (m×p)-number of units of the first matrix.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
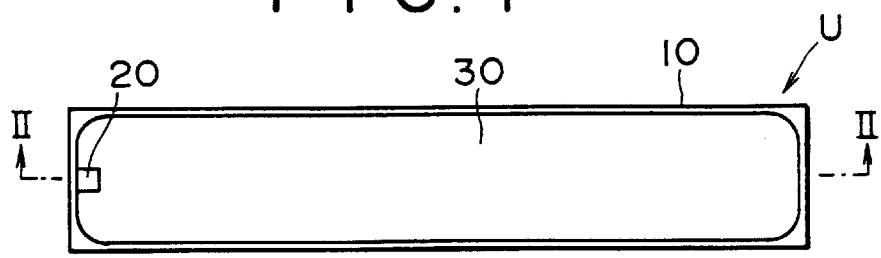
FIG. 1 is a plan view diagrammatically showing a superconductor unit used for forming a bulk superconductor according to the present invention.
Figure 2:
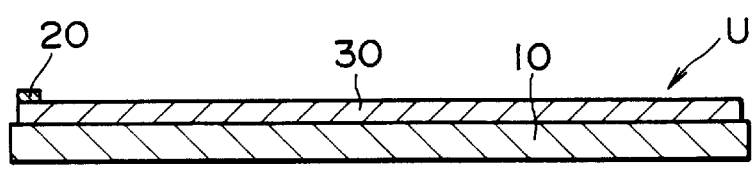
FIG. 2 is a sectional view taken on the line II—II in FIG. 1.

Referring first to FIGS. 1 and 2, designated generally as U is a superconductor unit including a substrate 10 and a superconductive layer 30 formed on the substrate 10. The substrate 10 is generally a single metal oxide crystal, such as $ZrO_2$ and MgO, and the superconductive layer 30 is a R—Ba—Cu—O superconductor, where R is selected from La, Nd, Sm, Eu, Gd, Y, Dy, Ho, Er, Tm, Yb and mixtures thereof.

The superconductor unit U may be prepared by, for example, applying a paste containing a heat-treated mixture of $R_2O_3$, $BaCO_3$, CuO and having a predetermined R:Ba:Cu atomic ratio onto a substrate 10. The paste may be obtained by dispersing the mixture in a suitable organic dispersing liquid, such as isopropanol, optionally containing an organic binder such as polyvinyl butyral.

Figure 3:
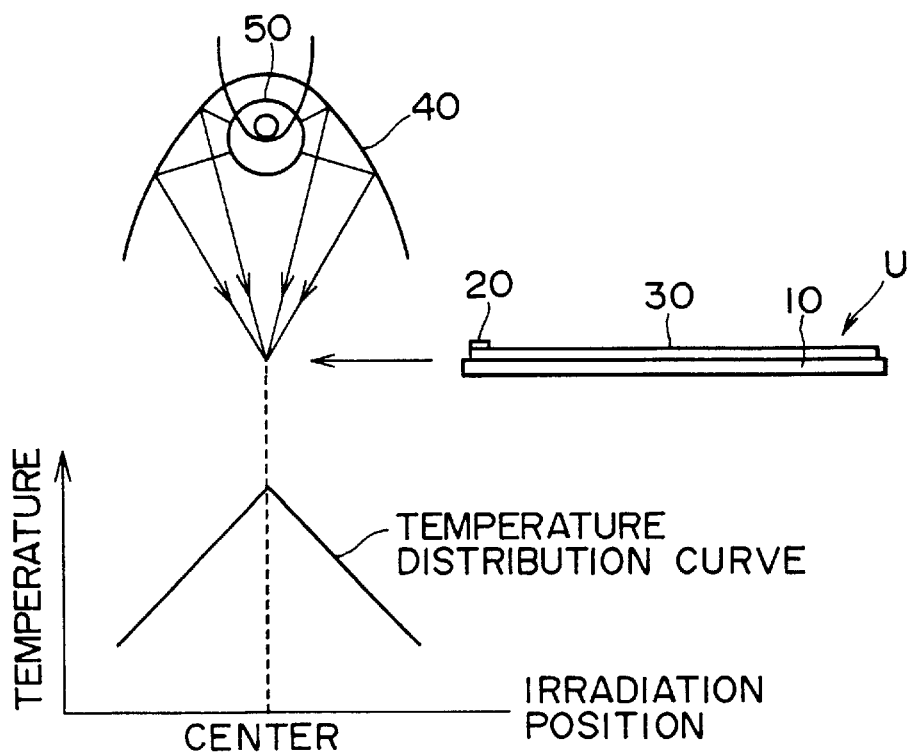
FIG. 3 is a schematic illustration of a furnace used in the method for the preparation of a bulk superconductor and of a temperature distribution within the furnace.

A seed crystal 20 such as $NdBa_2Cu_3O_x$ (Nd123) is then placed on one end of the coated paste. The resulting substrate 10 having the paste layer bearing the seed crystal 20 is introduced into a furnace having such a temperature gradient as shown in FIG. 3. The temperature is highest at a center where the superconductive particles are partly melted and is gradually decreased toward opposite directions with a temperature gradient of in the range of 1° C./cm and 100° C./cm. The substrate 10 is horizontally displaced within the furnace at a rate of 0.1–10 cm/hour with the seed crystal bearing end being the leading end, so that the paste layer is successively subjected to a heat treatment from the seed crystal bearing end to the opposite end thereof. Thus, the superconductive phase gradually grows from the seed crystal bearing end to the opposite end during the passage through the furnace.

In the embodiment shown in FIGS. 1 and 2, the substrate 10 is not entirely covered with the superconductive layer 30, namely a marginal portion of the substrate 10 remains uncovered with the superconductive layer 30. Such a structure is, however, not essential. One side of the substrate 10 may be entirely covered with the superconductive layer 30, if desired.

In the present invention, a plurality of such units U constitute a bulk of superconductor such as in the form of a cable, tape and plate as will be described below. Since the units U used in the following embodiments have the same structure as that shown in FIGS. 1 and 2, similar reference numerals are used for designating the same parts in FIGS. 4–7.

Figure 4:
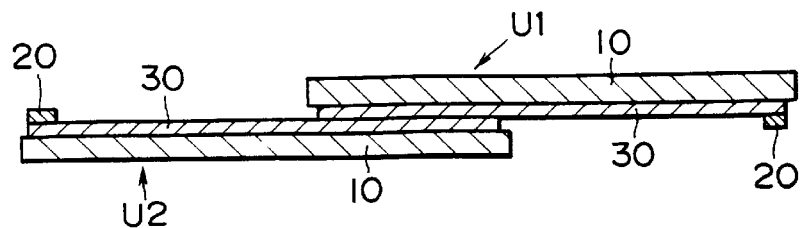
FIG. 4 is a sectional view diagrammatically illustrating one embodiment of a bulk superconductor according to the present invention.

FIG. 4 illustrates the most simple structure according to the present invention, in which two units U1 and U2 each similar to the unit U shown FIGS. 1 and 2 are assembled together such that respective Superconductive layers 30 are superconductively joined or connected with each other. The term "superconductively joined" or "superconductively connected" used herein is intended to refer to the connection of the superconductive layer 30 of one unit and the superconductive layer 30 of another unit such that the interface therebetween remains superconductive so that a superconducting current can flow from the one unit to the another unit. The assembling is preferably carried out by heating the two units U1 and U2 at a temperature of 900–1,000° C. while pressing the two units U1 and U2 to each other at a pressure of 0.1 kgf/cm$^2$ to 10 kgf/cm$^2$ with respective superconductive layers 30 being maintained in contact with each other.

Figure 5:
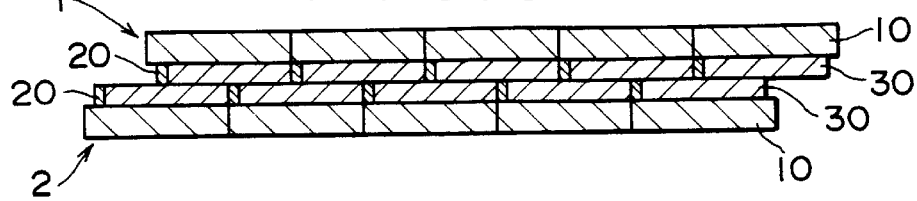
FIG. 5 is a sectional view diagrammatically illustrating an elongated superconductor according to the present invention.

FIG. 5 depicts another embodiment of the present invention in the form of an elongated superconductor. The elongated superconductor includes a first array 1 of one or more, m-number of units (5 units in the illustrated embodiment) and a second array 2 of two or more, n-number of units (5 units in the illustrated embodiment), wherein m=n or m=n−1. The first and second arrays 1 and 2 are assembled together such that the superconductive layer 30 of each one of the units of the first array 1, except one of the terminal units when m=n, is in contact with and in superconductor joining with two superconductive layers 30 of adjacent two units of the second array 2, so that the superconductive layers 30 of the n-number of units of the second array 2 are superconductively connected to each other through the superconductive layers 30 of the m-number of units of the first array 1. The assembling of the first and second arrays 1 and 2 may be carried out in the same manner as that in the first embodiment, i.e. by heating the first and second arrays 1 and 2 at a temperature of 900–1,000° C. while pressing the first and second arrays to each other at a pressure of 0.1 kgf/cm$^2$ to 10 kgf/cm$^2$.

Figure 6:
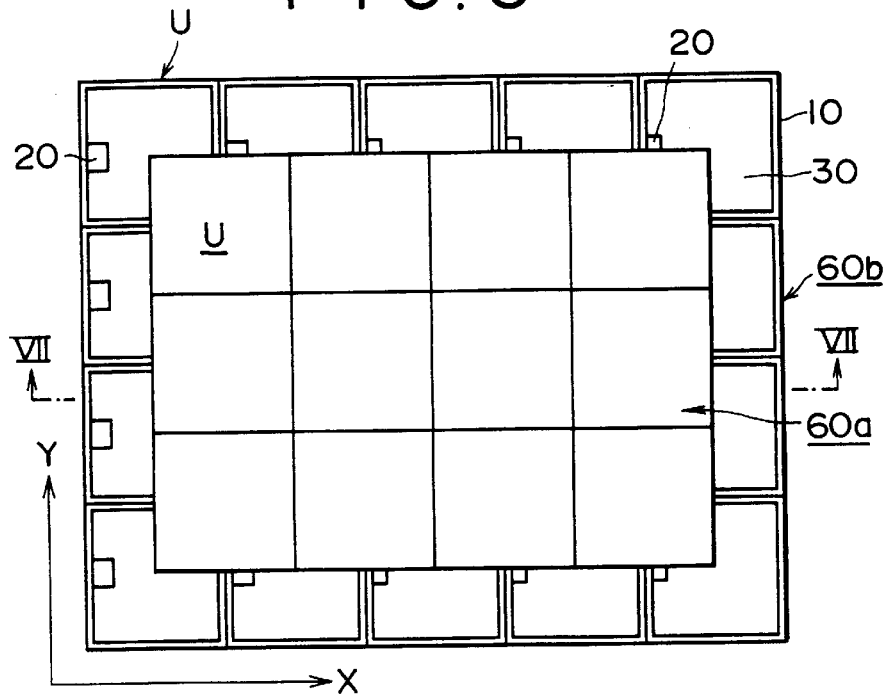
FIG. 6 is a plan view diagrammatically showing a bulk superconductor in the form of a plate according to the present invention.
Figure 7:
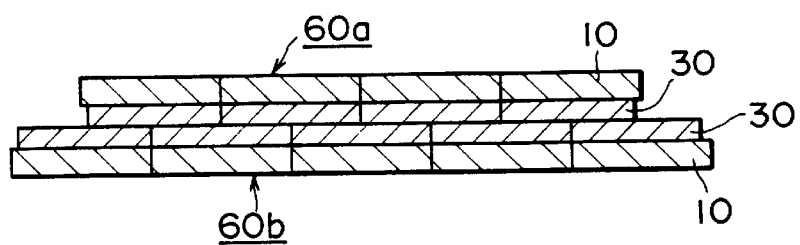
FIG. 7 is a sectional view taken on the line VII—VII in FIG. 6.

In the specific embodiment shown in FIG. 5, adjacent two units in the first and second arrays 1 and 2 are abutting engagement with each other. But this is not essential. Adjacent two units may be spaced apart from each other, if desired FIGS. 6 and 7 illustrate a further embodiment of the present invention in the form of a superconductive plate. The superconductive plate includes a first, m×p matrix 60a of units with m-number of first to m-th columns (first to fourth columns in the illustrated embodiment) arranged along the X-axis and p-number of first to p-th rows (first to third rows in the illustrated embodiment) arranged along the Y-axis, wherein m is one or more and p is one or more, and a second, n×q matrix 60b of units with n-number of first to n-th columns (first to fifth columns in the illustrated embodiment) arranged along the X-axis and q-number of first to q-th rows (first to fourth rows in the illustrated embodiment) arranged along the Y-axis, wherein m=n or m=n−1 and p=q or p=q−1.

Each of the units V of the first and second matrixes 60a and 60b includes a substrate 10 and a superconductive layer 30 of R—Ba—Cu—O formed on the substrate.

The first and second matrixes 60a and 60b are assembled together such that the superconductive layer of each one of the units of the first to n-th columns, except one of the terminal units when m=n, is in contact with and in superconductor joining with two superconductive layers of adjacent two units of the first to m-th columns, respectively, and that the superconductive layer of each one of the units of the first to q-th rows, except one of the terminal units when p=q, is in contact with and in superconductor joining with two superconductive layers of adjacent two units of the first to p-th rows, respectively, so that the superconductive layers of the (n×q)-number of units of the second matrix 60b are superconductively connected to each other through respective superconductive layers of the (m×p)-number of units of the first matrix 60a. The assembling of the first and second matrixes 60a and 60b may be carried out in the same manner as that in the foregoing embodiment. In the specific embodiment shown in FIG. 6, adjacent two units in each column and each row of the first and second matrixes 60a and 60b are abutting engagement with each other. But this is not essential. Adjacent two units may be spaced apart from each other, if desired, The following examples will further illustrate the present invention.

EXAMPLE 1

Three kinds of raw materials $Y_2O_3$, $BaCO_3$ and $CuO$ were blended to provide a Y:Ba:cu atomic ratio of 1.8:2.4:3.4. The composition of this blend was such as to form an oxide superconductor including $YBa_2Cu_3O_x$ (Y123) phase and $Y_2BaCuO_5$ (Y211) phase. The blend was calcined at 900° C. for 24 hours and then melted at 1,400° C. for 20 minutes. The melted mass was quenched by a nip of hammers made of copper and then finely pulverized in a mortar. The pulverized mass was mixed with the same amount of a binder solution (an isopropanol solution containing 10% by weight of polyvinyl butyral) to form a paste. The paste was applied with a screen printing device onto a surface of a $ZrO_2$ substrate (10 in FIG. 1) having a length of 50 mm, a width of 10 mm and a thickness of 1 mm to form a paste layer of 0.2 mm thick. A seed crystal (20 in FIG. 1) of $NdBa_2Cu_3O_x$ (Nd123) cut to have an a-axis length of 1 mm, a b-axis length of 1 mm and a c-axis length of 0.1 mm was placed on one longitudinal end of the paste layer such that the c-axis of the crystal is oriented in the direction normal to the surface of the substrate. The substrate having the paste layer was then placed in an oven at 150° C. for 30 minutes in air to evaporate the isopropanol and thereafter maintained at 600° C. for 30 minutes to decompose the binder.

The substrate having the paste layer was then heat-treated using a furnace as shown in FIG. 3. The furnace had a heating lamp 50 backed by light collecting mirrors 40. The inside of the furnace had a temperature distribution shown by the graph in FIG. 3. The center of the furnace provided the maximum temperature of 1,020° C. The temperature decreased radially outward at a rate of 10° C./cm. The substrate having the paste layer was horizontally displaced in the furnace at a rate of 1 cm/hour with the seed crystal-bearing side being the leading end, so that the superconductive particles were fused and grown to form a superconductive layer. Namely, during the passage of the paste layer through the furnace, the superconductive particles were partly fused when they reached the center of the furnace having the maximum temperature of 1,020° C. and the fused particles were then solidified upon leaving the center of the furnace, thereby growing the superconductive layer. The resulting heat-treated product was heated at 500° C. for 100 hours in an oxygen atmosphere to obtain a Y123 superconductor unit (U in FIG. 1) having a superconductor layer (30 in FIG. 1). The superconductor layer had a critical current density of 55,000 A/cm$^2$ at 77K in zero magnetic field when measured by the pulsed current method.

A number of similar superconductor units were prepared. A pair of such units were each polished so that respective superconductor layers had a surface roughness of 1 μm or less. The two units (U1 and U2 in FIG. 4) were assembled together such that the polished superconductor layers were in contact with each other. Thus, the two units were heated at 950° C. for 10 minutes while applying a pressure of 1 kgf/cm$^2$ to the contact surfaces. The assembly was cooled to room temperature and then annealed at 500° C. for 100 hours in an oxygen stream at 1 atm to obtain a bulk superconductor having a critical current density of 45,000 A/cm$^2$ at 77K in zero magnetic field when measured by the pulsed current method.

EXAMPLE 2

Example 1 was repeated in the same manner as described except that the furnace used had such a temperature distribution that the temperature decreased radially outward at a rate of 1° C./cm, and that the paste layer-bearing substrate was displaced through the furnace at rates of 0.1 cm/hour, 1 cm/hour and 10 cm/hour, thereby giving superconductor units having critical current densities of 30,000, 40,000 and 35,000 A/cm$^2$, respectively, at 77K in zero magnetic field, while the assembled bulk superconductors obtained from these superconductor units had critical current densities of 28,000, 35,000 and 30,000 A/cm$^2$, respectively, at 77K in zero magnetic field

EXAMPLE 3

Example 1 was repeated in the same manner as described except that the furnace used had such a temperature distribution that the temperature decreased radially outward at a rate of 100° C./cm, and that the paste layer-bearing substrate was displaced through the furnace at rates of 0.1 cm/hour, 1 cm/hour and 10 cm,/hour, thereby giving superconductor units having critical current densities of 32,000, 36,000 and 33,000 A/cm$^2$, respectively, at 77K in zero magnetic field, while the assembled bulk superconductors obtained from these superconductor units had critical current densities of 27,000, 34,000 and 29,000 A/cm$^2$, respectively, at 77K in zero magnetic field.

EXAMPLE 4

Example 1 was repeated in the same manner as described except that a R—Ba—Cu—O (where R is Nd, Sm, Eu, Gd, Dy, Ho, Er, Tm or Yb) superconductor layer was formed in place of Y—Ba—Cu—O. The bulk superconductors were found to have critical current densities of 50,000 A/cm$^2$ (R=Nd), 60,000 A/cm$^2$ (R=Sm), 65,000 A/cm$^2$ (R=Eu), 35,000 A/cm$^2$ (R=Gd), 40,000 A/cm$^2$ (R=Dy), 30,000 A/cm$^2$ (R=Ho), 30,000 A/cm$^2$ (R=Er), 25,000 A/cm$^2$ (R=Tm) and 20,000 A/cm$^2$ (R=Yb) at 77K in zero magnetic field.

EXAMPLE 5

A number of bulk superconductors as shown in FIG. 4 were prepared and assembled to form an elongated superconductor as shown in FIG. 5. The assembling was carried out at 950° C. for 10 minutes while applying a pressure of 1 kgf/cm$^2$ to the contact surfaces. The assembly was cooled to room temperature and then annealed at 500° C. for 100 hours in an oxygen stream at 1 atm to obtain an elongated bulk superconductor.

EXAMPLE 6

A number of bulk superconductors as shown in FIG. 4 were prepared and assembled to form a plate-like superconductor as shown in FIG. 6. The assembling was carried out at 950° C. for 10 minutes while applying a pressure of 1 kgf/cm$^2$ to the contact surfaces. The assembly was cooled to room temperature and then annealed at 500° C. for 100 hours in an oxygen stream at 1 atm to obtain a bulk superconductor in the form of a plate.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A bulk superconductor comprising a plurality of units each including a substrate and a superconductive layer of R—Ba—Cu—O, where R is selected from La, Nd, Sm, Eu, Gd, Y, Dy, Ho, Er, Tm, Yb and mixtures thereof, formed on the substrate, said units being arranged in a row or in a matrix such that the superconductive layers of respective units are superconductively joined with each other and wherein the superconductive layer of each of said units includes a seed crystal at one end thereof, said seed crystal of each of said units except for at least one terminal unit being in contact with the superconductive layer of another of said units.

2. A bulk superconductor as claimed in claim 1 wherein all of said units are arranged extending between opposing edges of the bulk superconductor and having said one end of each of said units oriented toward the same one of said opposing edges of said bulk superconductor.

3. A bulk superconductor as claimed in claim 2 wherein said units are arranged in at least one row with superimposed first and second unit layers of said units arranged with their superconductive layers face-to-face, the units of said second unit layer being staggered relative to the units of said first unit layer.

4. A bulk superconductor comprising a first array of one or more, m-number of units and a second array of two or more, n-number of units, wherein m=n or m=n−1;

each of said units of said first and second arrays including a substrate and a superconductive layer of R—Ba—Cu—O, where R is selected from La, Nd, Sm, Eu, Gd, Y, Dy, Ho, Er, Tm, Yb and mixtures thereof, formed on said substrate, said first and second arrays being assembled together such that the superconductive layer of each one of said units of said first array, except one terminal unit when m=n, is in contact with and in superconductor joining with two superconductive layers of adjacent two units of said second array, so that said superconductive layers of said n-number of units of said second array are superconductively connected to each other through said superconductive layers of said m-number of units of said first array and wherein the superconductive layer of each of said units of said first and second arrays includes a seed crystal at one end thereof, said seed crystal of each of said units except for said one terminal unit being in contact with the superconductive layer of another of said units.

5. A bulk superconductor as claimed in claim 4 wherein all of said units are arranged extending between opposing edges of the bulk superconductor and having said one end of each of said units oriented toward the same one of said opposing edges of said bulk superconductor.

6. A bulk superconductor comprising a first, m×p matrix of units with m-number of first to m-th columns arranged along the X-axis and p-number of first to p-th rows arranged along the Y-axis, wherein m is two or more and p is two or more, and a second, n×q matrix of units with n-number of first to n-th columns arranged along the X-axis and q-number of first to q-th rows arranged along the Y-axis, wherein m=n or m=n−1 and p=q or p=q−1, each of said units of said first and second matrixes including a substrate and a superconductive layer of R—Ba—Cu—O, where R is selected from La, Nd, Sm, Eu, Gd, Y, Dy, Ho, Er, Tm, Yb and mixtures thereof, formed on said substrate, said first and second matrixes being assembled together such that the superconductive layer of each one of said units of said first to n-th columns, except for at least one terminal unit when m=n, is in contact with and in superconductor joining with two superconductive layers of adjacent two units of said first to m-th columns, respectively, and that the superconductive layer of each one of said units of said first to q-th rows, except for at least one terminal unit when p=q, is in contact with and in superconductor joining with two superconductive layers of adjacent two units of said first to p-th rows, respectively, so that said superconductive layers of said (n×q)-number of units of said second matrix are superconductively connected to each other through respective superconductive layers of said (m×p)-number of units of said first matrix;

and wherein the superconductive layer of each of said units of said first and second matrixes includes a seed crystal at one end thereof, said seed crystal of each of said units except for said at least one terminal unit being in contact with the superconductive layer of another of said units.

7. A bulk superconductor as claimed in claim 6 wherein all of said units are arranged extending between opposing edges of the bulk superconductor and having said one end of each of said units oriented toward the same one of said opposing edges of said bulk superconductor.

8. A method of fabricating a bulk superconductor, comprising the steps of:

applying a paste to a surface of each of a plurality of substrates to form a paste layer on each substrate, said paste containing R, Ba and Cu, wherein R' is selected from the group consisting of La, Nd, Sm, Eu, Gd, Y, Dy, Ho, Er, Tm, Yb and mixtures thereof;

placing a seed crystal at one end of each paste layer;

heating each paste layer from the seed crystal bearing end to convert said paste layer to a superconductive layer of R—Ba—Cu—O, thereby forming a plurality of units;

providing a first array of one or more, m-number of said units and a second array of two or more, n-number of said units, wherein m=n or m=n−1; and assembling said first and second arrays together such that the superconductive layer of each one of said units of said first array, except one terminal unit when m=n, is in contact with and in superconductor joining with two superconductive layers of adjacent two units of said second array, so that said superconductive layers of said n-number of units of said second array are superconductively connected to each other through said superconductive layers of said m-number of units of said first array.

9. A method as claimed in claim 8, wherein said assembling is carried out by heating said first and second arrays at a temperature of 900–1,000° C. while pressing said first and second arrays to each other at a pressure of 0.1–10 kgf/cm$^2$.

10. A method of fabricating a bulk superconductor, comprising the steps of:

applying a paste to a surface of each of a plurality of substrates to form a paste layer on each substrate, said paste containing R, Ba and Cu, wherein R is selected from the group consisting of La, Nd, Sm, Eu, Gd, Y, Dy, Ho, Er, Tm, Yb and mixtures thereof;

placing a seed crystal at one end of each paste layer;

heating each paste layer from the seed crystal bearing end to convert said paste layer to a superconductive layer of R—Ba—Cu—O, thereby forming a plurality of units;

providing a first, m×p matrix of said units with m-number of first to m-th columns arranged along the X-axis and p-number of first to p-th rows arranged along the Y-axis, wherein m is two or more and p is two or more, and a second, n×q matrix of units with n-number of first to n-th rows arranged along the X-axis and q-number of first to q-th rows arranged along the Y-axis, wherein m=n or m=n−1 and p=q or p=q−1; and assembling said first and second matrixes together such that the superconductive layer of each one of said units of said first to n-th columns, except one terminal unit when m=n, is in contact with and in superconductor joining with the superconductive layers of adjacent two units of said first to m-th columns, respectively, and that the superconductive layer of each one of said units of said first to q-th rows, except one terminal unit when p=q, is in contact with and in superconductor joining with two superconductive layers of adjacent two units of said first to p-th rows, respectively, so that said superconductive layers of said (n×q)-number of units of said second matrix are superconductively connected to each other through respective superconductive layers of said (m×p)-number of units of said first matrix.

11. A method as claimed in claim 10, wherein said assembling is carried out by heating said first and second matrixes at a temperature of 900–1,000° C. while pressing said first and second matrixes to each other at a pressure of 0.1–10 kgf/cm$^2$.

* * * * *